(12) United States Patent
Nagel et al.

(10) Patent No.: US 9,722,174 B1
(45) Date of Patent: Aug. 1, 2017

(54) LOW DIELECTRIC CONSTANT INTERLAYER DIELECTRICS IN SPIN TORQUE MAGNETORESISTIVE DEVICES

(71) Applicant: EVERSPIN TECHNOLOGIES, INC., Chandler, AZ (US)

(72) Inventors: Kerry Joseph Nagel, Scottsdale, AZ (US); Sanjeev Aggarwal, Scottsdale, AZ (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days.

(21) Appl. No.: 14/593,445

(22) Filed: Jan. 9, 2015

Related U.S. Application Data

(60) Provisional application No. 62/058,548, filed on Oct. 1, 2014.

(51) Int. Cl.
| | |
|---|---|
| *H01L 43/12* | (2006.01) |
| *H01L 21/00* | (2006.01) |
| *H01L 43/02* | (2006.01) |
| *H01L 43/08* | (2006.01) |

(52) U.S. Cl.
CPC .............. *H01L 43/12* (2013.01); *H01L 43/08* (2013.01)

(58) Field of Classification Search
CPC ......... H01L 43/02; H01L 43/12; H01L 43/08; H01L 43/10; H01L 27/11507; H01L 23/49506; H01L 21/76807; H01L 21/76877; H01L 21/76819; H01L 29/685; H01L 2924/1434; H01L 2924/1441; H01L 2924/1435; H01L 45/04; H01L 21/8229; H01L 21/8239; H01L 27/222–27/228; H01L 43/00–43/14; G11C 11/15; G11C 19/08; G11C 14/0036; G11C 14/0081

USPC ...... 438/3; 257/295, 421, E21.001, E21.665, 257/E43.001, E43.006; 428/457, 337, 428/621, 216, 411.1

See application file for complete search history.

(56) References Cited

U.S. PATENT DOCUMENTS

| | | | |
|---|---|---|---|
| 2003/0119211 A1* | 6/2003 | Summerfelt | H01L 21/31122 438/3 |
| 2003/0180968 A1* | 9/2003 | Nallan | H01L 23/564 438/3 |
| 2004/0026369 A1* | 2/2004 | Ying | B82Y 40/00 216/63 |
| 2004/0041239 A1* | 3/2004 | Ruelke | H01L 21/76807 257/637 |
| 2005/0051820 A1* | 3/2005 | Stojakovic | G11C 11/22 257/295 |

(Continued)

*Primary Examiner* — Julia Slutsker
*Assistant Examiner* — Natalia Gondarenko
(74) *Attorney, Agent, or Firm* — Bookoff McAndrews, PLLC

(57) ABSTRACT

By manufacturing magnetoresistive devices using low-k dielectric materials as the inter-layer dielectrics and higher-k dielectric materials for hard masks and encapsulation, the overall dielectric constant characteristics of the magnetoresistive devices can be kept lower, thereby decreasing capacitance and allowing for higher speed operations. Elimination or reduction of residual higher-k dielectric material through stripping or other processes minimizes "islands" of higher-k dielectric material that can detract from overall dielectric constant performance. One or more masking and one or more etching steps can be used to form the devices either with or without the additional stripping of the higher-k material.

16 Claims, 25 Drawing Sheets

(56) References Cited

U.S. PATENT DOCUMENTS

| | | | |
|---|---|---|---|
| 2009/0209050 A1* | 8/2009 | Wang | H01L 27/228 438/3 |
| 2012/0028373 A1* | 2/2012 | Belen | H01L 43/12 438/3 |
| 2013/0119494 A1* | 5/2013 | Li | H01L 43/08 257/421 |
| 2015/0263267 A1* | 9/2015 | Kanaya | H01L 43/08 257/421 |

* cited by examiner

LOW DIELECTRIC CONSTANT INTERLAYER DIELECTRICS IN SPIN TORQUE MAGNETORESISTIVE DEVICES

CROSS REFERENCE TO RELATED APPLICATION

This application claims priority to U.S. Provisional Application No. 62/058,548 filed Oct. 1, 2014. The contents of that provisional application are incorporated by reference herein in their entirety.

TECHNICAL FIELD

The disclosure herein relates generally to magnetoresistive devices and more particularly to the use of low-dielectric constant interlayer dielectrics in such devices and methods for manufacturing such devices.

BACKGROUND

Magnetoresistive memory devices store information by varying the resistance across the memory device such that a read current through a memory cell in the memory device will result in a voltage drop having a magnitude that is based on the information stored in the memory cell. For example, in certain magnetic memory devices, the voltage drop across a magnetic tunnel junction (MTJ) can be varied based on the relative magnetic states of the magnetic layers within the memory cell. In such memory devices, there is typically a portion of the memory cell that has a fixed magnetic state and another portion that has a free magnetic state that is controlled to be either parallel or antiparallel to the fixed magnetic state. Because the resistance through the memory cell changes based on whether the free portion is parallel or antiparallel to the fixed portion, information can be stored by setting the orientation of the free portion. The information is later retrieved by sensing the orientation of the free portion. Such magnetic memory devices are well known in the art.

Writing magnetic memory cells can be accomplished by sending a spin-polarized write current through the memory device where the angular momentum carried by the spin-polarized current can change the magnetic state of the free portion. One of ordinary skill in the art understands that such a current can either be directly driven through the memory cell or can be the result of applying one or more voltages where the applied voltages result in the desired current. Depending on the direction of the current through the memory cell, the resulting magnetization of the free portion will either be parallel or antiparallel to the fixed portion. If the parallel orientation represents a logic "0", the antiparallel orientation may represent a logic "1", or vice versa. Thus, the direction of write current flow through the memory cell determines whether the memory cell is written to a first state or a second state. Such memory devices are often referred to as spin torque transfer memory devices. In such memories, the magnitude of the write current is typically greater than the magnitude of a read current used to sense the information stored in the memory cells.

Manufacturing magnetoresistive devices, including MTJ devices, includes a sequence of processing steps during which many layers of materials are deposited and then patterned to form a magnetoresistive stack and the electrodes used to provide electrical connections to the magnetoresistive stack. The magnetoresistive stack includes the various layers that make up the free and fixed portions of the device as well as one or more dielectric layers that provide at least one the tunnel junction for the MTJ device. In many instances, the layers of material are very thin, on the order of a few or tens of angstroms. Similarly, the dimensions of such layers after patterning and etching are extremely small, and small deviations or imperfections during processing can have a significant impact on device performance.

Because an MRAM device may include millions of MTJ elements, precise processing steps used in manufacturing the devices can contribute to increased densities by allowing devices to be placed in close proximity without unwanted interaction. Moreover, such accurate processing helps to minimize deviations in device characteristics, such as switching voltages, across devices included in the MRAM. Therefore, it is desirable to provide techniques for manufacturing such devices that support increased densities and promote minimizing the variance of certain characteristics amongst devices.

DETAILED DESCRIPTION

Figure 1:
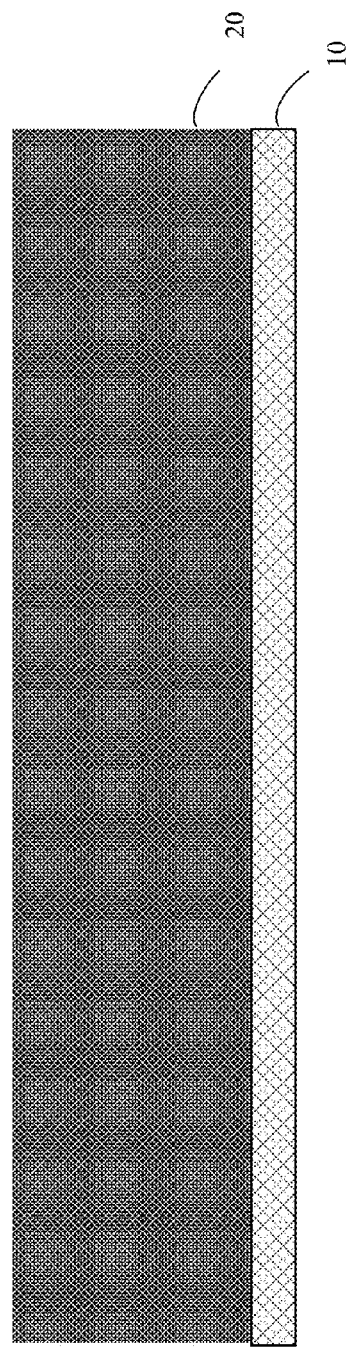
FIGS. 1-8 illustrate cross-sectional views of layers included in a magnetoresistive device during different stages of manufacturing in accordance with an exemplary embodiment.

For simplicity and clarity of illustration, the figures depict the general structure and/or manner of construction of the various embodiments. Descriptions and details of well-known features and techniques may be omitted to avoid unnecessarily obscuring other features. Elements in the figures are not necessarily drawn to scale: the dimensions of some features may be exaggerated relative to other elements to improve understanding of the example embodiments. For example, one of ordinary skill in the art appreciates that the cross-sectional views are not drawn to scale and should not be viewed as representing proportional relationships between different layers. The cross-sectional views are provided to help illustrate the processing steps performed by simplifying the various layers to show their relative positioning. Moreover, while certain layers and features are illustrated with straight 90-degree edges, in actuality or practice such layers may be more "rounded" and gradually sloping.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or that not exposed to the radiation, is removed by the application of a developer. An etch may then be applied to the underlying layer not protected by the remaining resist such that the layer overlying the substrate is patterned. Alternatively, an additive process can be used in which a structure is built up using the photoresist as a template.

There are many inventions described and illustrated herein, as well as many aspects and embodiments of those inventions. As described in further detail below, the magnetic material stack may include many different layers of material, where some of the layers include magnetic materials, whereas others do not. In one embodiment, the methods of manufacturing include forming the layers for the magnetoresistive device and then masking and etching those layers to produce a magnetic tunnel junction (MTJ) device. Examples of MTJ devices include transducers such as electromagnetic sensors as well as memory cells.

In one aspect, the described embodiments relate to, among other things, a magnetoresistive-based device that includes interlayer dielectrics having a relatively low dielectric constant ("low-k dielectrics") and methods for manufacturing such devices. In magnetoresistive memory devices, having interlayer dielectrics with low dielectric constants provides reduced capacitance and higher speed operation. However, low-k dielectrics are typically very porous, making them less useful as hard mask layers that are used to define aspects of each memory cell. Dielectric materials having higher dielectric constants are more robust as hard masks and more suitable for patterning magnetic tunnel junction memory cells and related structures. Because memory cells are placed in close proximity within magnetoresistive memory devices, patterning the memory cells can be challenging, and precise aspect ratios and etch selectivity becomes increasingly important. As such, low-k dielectrics are typically not suitable as hard masks in the manufacture of such devices. Moreover, low-k dielectric materials typically require higher temperatures deposition, and spin torque devices benefit from lower deposition temperatures during formation of various parts of the device. Higher temperatures typically can be tolerated for later process steps including those less closely associated with formation of the layers making up the device. Therefore, low-k dielectrics can be used as interlayer dielectrics when they are deposited either before or after critical layers in the device have been formed.

As described herein, higher dielectric constant materials are used as hard masks and for encapsulation, while lower dielectric constant materials are used as the interlayer dielectrics. Because higher dielectric constant materials left behind in the device structure can detract from the overall dielectric constant performance of the device, minimization of residual higher dielectric constant materials is desirable. As such, after using the higher dielectric constant materials as hard masks and for encapsulation, additional steps may be taken to minimize any remaining high dielectric constant material, where such additional steps may include stripping steps that target removal of such materials.

FIGS. 1-8 illustrate cross-sectional views of the manufacture of a magnetoresistive device in accordance with one example embodiment. Referring to FIG. 1, a low-k dielectric layer made up of layers 10 and 20 is deposited where each of layers 10 and 20 include low-k dielectric materials. The via that couples the magnetoresistive device to underlying circuitry is later formed within the layers 10 and 20. The layer 10 can function as both an etch stop and as a layer that prevents migration of metal material. For example, the layer 10 may be SiCOH, which blocks migration of metals such as copper. The layer 20 may be a low dielectric constant material such as porous silicon dioxide ($SiO_2$), which may be referred to as "black diamond." In other embodiments, only a single layer may be deposited instead of the two layers, more than two layers may be deposited, and other low-k dielectric materials may be used for the one or more layers.

Figure 2:
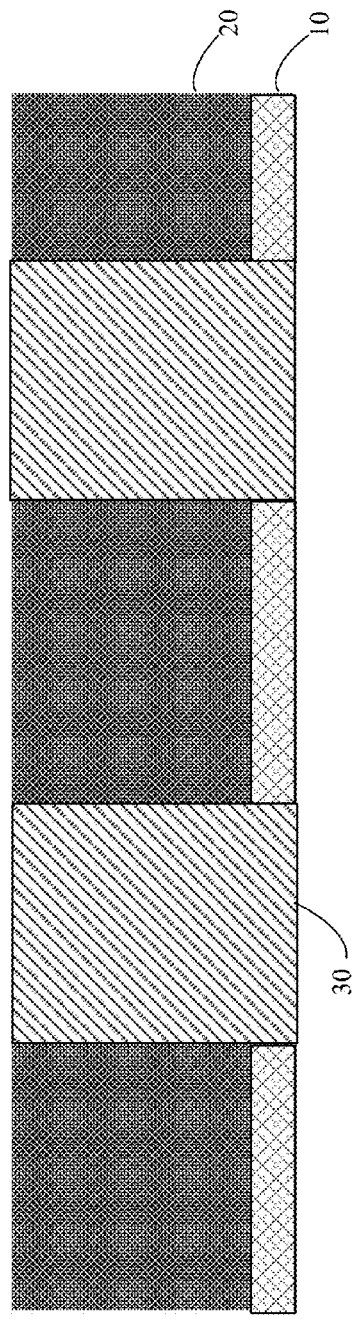

Referring to FIG. 2, a via 30 is formed within the layers 10 and 20. Formation of the via 30 includes patterning and etching through layers 10 and 20, which is then followed by deposition of conductive material such as copper to fill the via 30. Planarization may then be used to provide a level surface on which to continue device formation. The via 30 can be formed using various techniques, including those now known as well as those later developed. In some embodiments, the via 30 may be formed using techniques described in co-pending U.S. patent application Ser. No. 14/340,209, entitled "VIA FORMED UNDERLYING A MAGNETORESISTIVE DEVICE AND METHOD OF MANUFACTURE," which is hereby incorporated by reference in its entirety.

Figure 3:
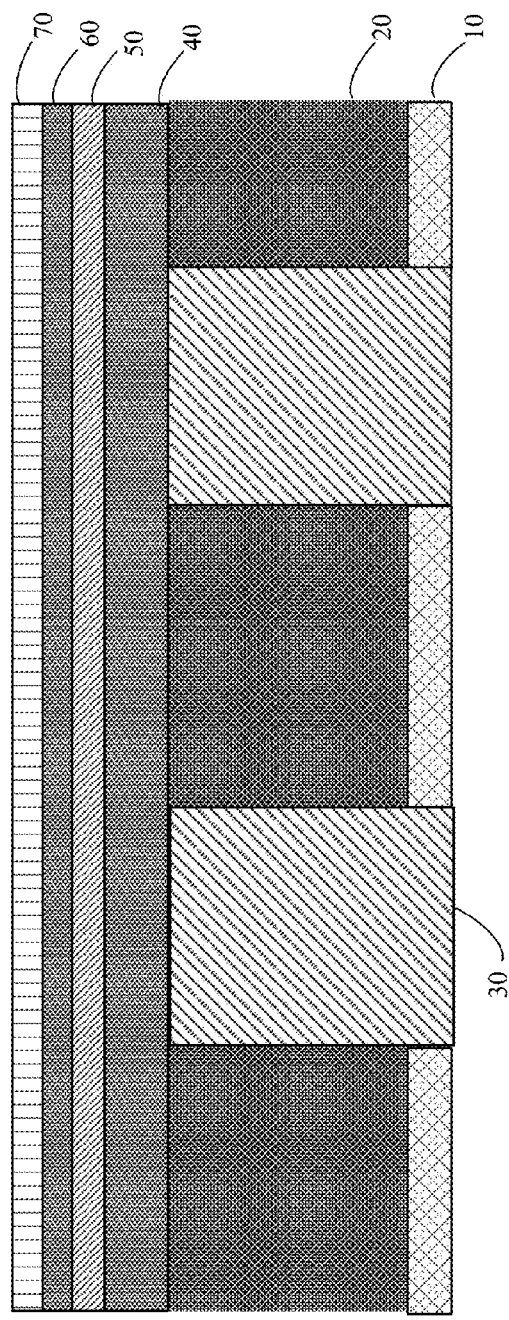

After formation of the via 30, the layers that will be used to form the top and bottom electrodes for the magnetoresistive device as well as those layers that make up the magnetoresistive stack are deposited. As shown in FIG. 3, a layer of conductive material 40 is deposited, where that material will be used to form the bottom electrode for the magnetoresistive device. The magnetic layers 50 are deposited over the layer of conductive material 40, where the magnetic layers 50 include those layers making up the magnetoresistive stack for the device. While described as the "magnetic layers," the layers 50 used to form the magnetoresistive stack may include a number of different layers of both magnetic and nonmagnetic material. For example, the layers may include multiple layers of magnetic material, dielectric layers that provide one or more tunnel barriers or diffusion barriers, coupling layers between layers of magnetic material that provide for ferromagnetic or antiferromagnetic coupling, anti-ferromagnetic material, and other layers utilized in magnetoresistive stacks as currently known or later developed. For example, layer 50 may include a set of layers forming a synthetic antiferromagnetic structure (SAF), a dielectric layer corresponding to a tunnel barrier, and a set of layers corresponding to a synthetic ferromagnetic structure (SYF). Other embodiments may include multiple SAFs, SYFs, and tunnel barriers, where the materials and structures are arranged in various combinations and permutations now known or later developed.

Another layer of conductive material 60 is deposited over the magnetic layers 50, where the layer 60 is used to form the top electrode for the magnetoresistive device. A layer of hard mask material 70, which is typically a higher dielectric constant material, is deposited over the layer of conductive material 60. In one example, the hard mask layer 70 includes silicon oxide.

Figure 4:
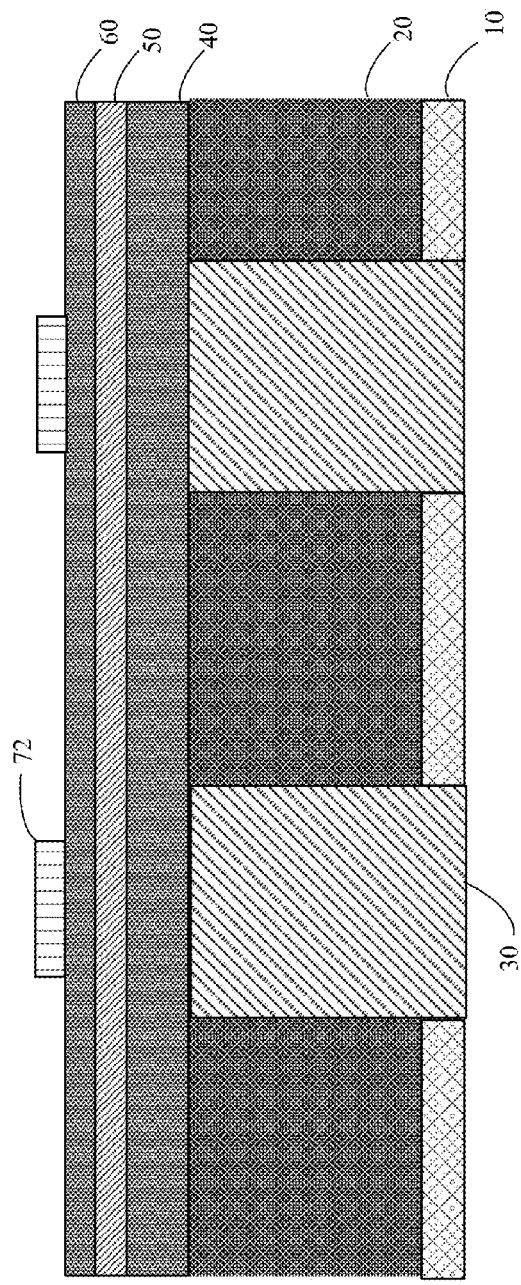

Turning to FIG. 4, the layer of hard mask material 70 is patterned based on the desired dimensions of the magnetoresistive device to be formed. Patterning of the hard mask material 70 produces a hard mask 72, where patterning of the hard mask material may include the use of photoresist and selective etching. As used herein, "hard" when used with "hard mask" means the ability to resist a particular etch. Examples of chemical etch processes used to form the hard mask include those using gases such as $CF_4$, $CHF_3$, $CH_2F_2$ and carrier gases such as Ar and Xe. Notably, the hard mask 72 may be etched, formed and/or patterned using any etchants and techniques now known or later developed—for example, using conventional etchants and techniques. Following definition of the hard mask 72, any photoresist used may be removed.

Figure 5:
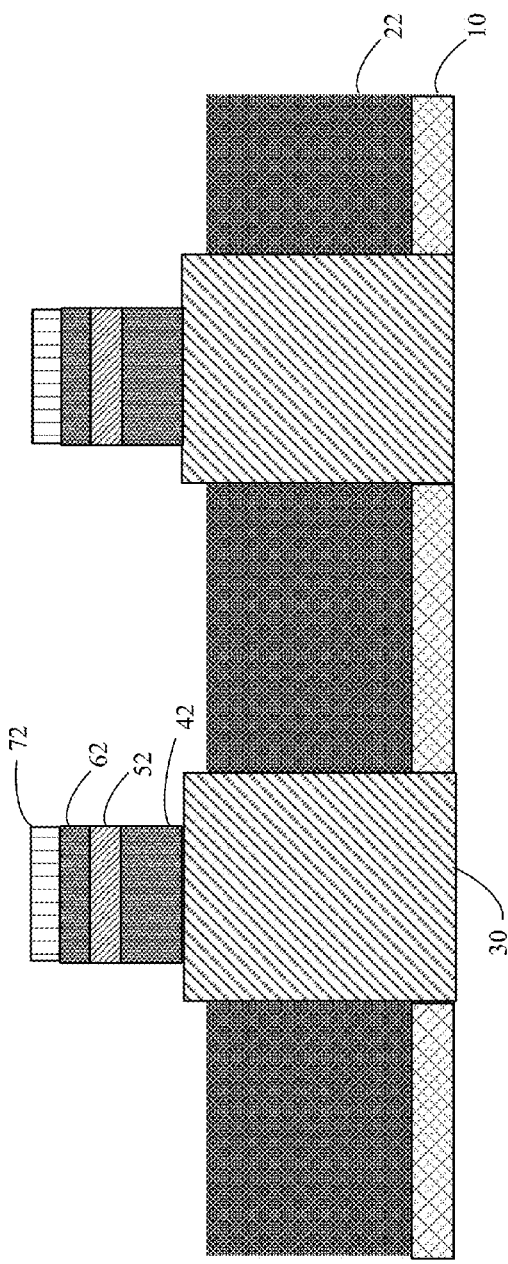
Figure 6:
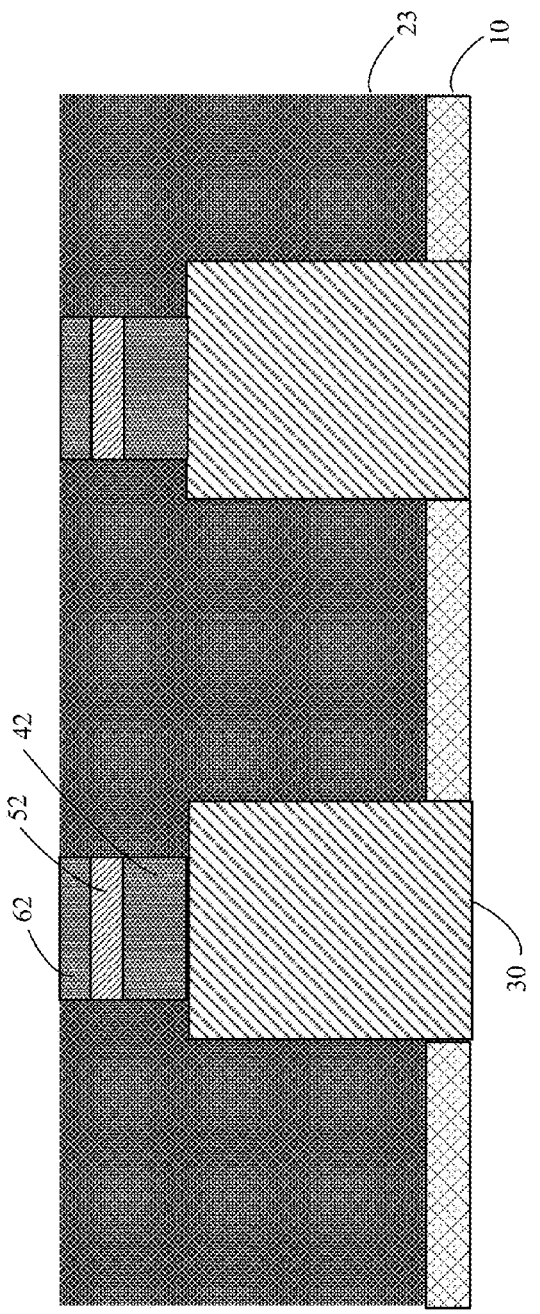

In the embodiment corresponding to FIGS. 1-8, the hard mask 72 is used as a template for etching the device structure using a single step etching process. FIG. 5 illustrates the resulting device structure, which includes a bottom electrode 42, a magnetoresistive stack 52, and a top electrode 62. Some etching into the layer of low-k interlayer dielectric 20 may occur, thereby resulting in layer 22. Following device formation by etching, additional low-k dielectric material is deposited to fill spaces in between the devices, resulting in layer 23 as shown in FIG. 6. Note that the low-k dielectric material deposited at this stage may be the same material used to form layer 20 or may be another low-k dielectric material or combination of materials.

Figure 7:
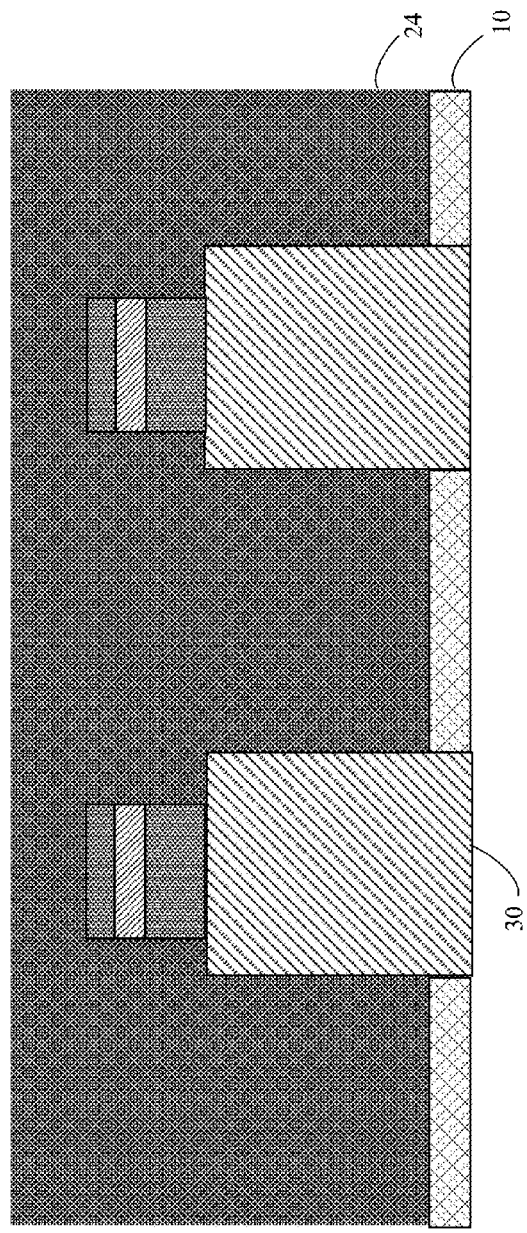
Figure 8:
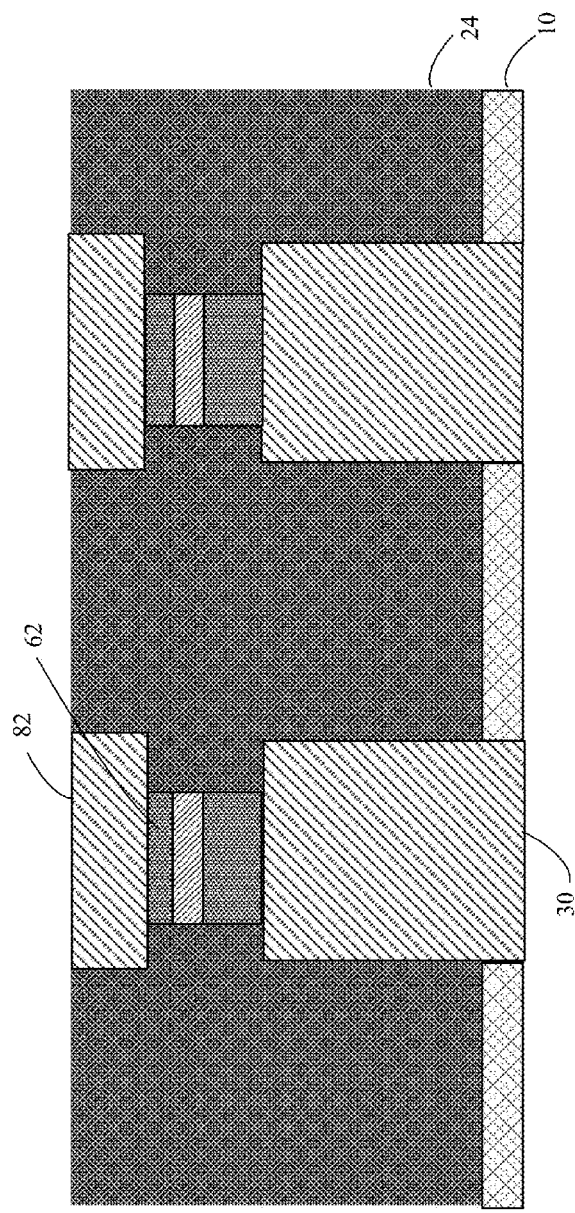

FIG. 6 also shows the hard mask 72 having been removed, which can be accomplished by, for example, polishing, which may also remove any extra dielectric material deposited that extends above the top electrode 62. After removal of the hard mask 72 to expose the top electrode 62, additional low-k dielectric material is deposited to form layer 24 as shown in FIG. 7. The low-k dielectric material deposited at this stage may be the same material used to form layer 20 or may be another low-k dielectric material or combination of materials. In some embodiments, the additional low-k material may include more than one layer of material similar to layers 10 and 20, where one of the layers helps to prevent migration of conductive materials such as copper. Further patterning and etching of portions of layer 24 is performed to facilitate electrical contact with the top electrode 62. As shown in FIG. 8, conductive material 82 is formed to make such contact. Conductive material 82 may be a via to other connective traces or circuits or, in other embodiments, may be a conductive trace such as a bit line in a magnetoresistive memory device.

Figure 9:
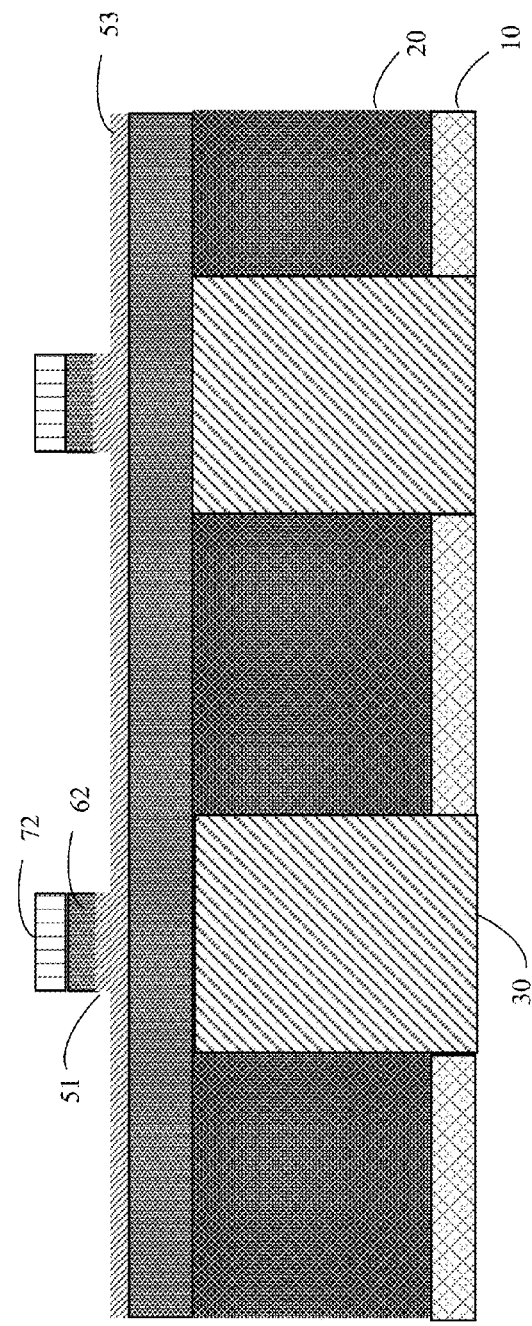
FIGS. 9-13 illustrate cross-sectional views of layers included in a magnetoresistive device during different stages of manufacturing in accordance with another exemplary embodiment.

While FIGS. 5-8 illustrate one embodiment employing a one-step etch to form the magnetoresistive device, device formation can include a number of separate etching steps as well as additional patterning steps. FIGS. 9-13 illustrate another embodiment that utilizes one masking (patterning) step and a two-step etch process to form the magnetoresistive device. FIG. 9 illustrates the result of a first etching step, where the starting point for the first etching step is substantially similar to the structure illustrated in FIG. 4. The hard mask 72 provides the pattern for formation of the top electrode 62 and a portion of the magnetoresistive stack 51. In some embodiments, the top electrode 62 may itself be formed using a two-step etch process such as that described in co-pending U.S. patent application Ser. No. 14/492,768 entitled "Top Electrode Etch in a Magnetoresistive Device and Devices Manufactured Using Same," which is incorporated by reference herein. In other embodiments, the top electrode 62 is formed using other techniques, both known and later developed.

Remaining layers of the magnetoresistive stack 53 are not yet etched as illustrated in FIG. 9. Using such a two-step etch to form the magnetoresistive device can provide advantages in allowing portions of the magnetoresistive stack to be encapsulated and protected during latter portions of the device formation. Such advantages, and more details regarding the two-step etch process, are discussed in related U.S. patent application Ser. No. 14/296,153, entitled "ISOLATION OF MAGNETIC LAYERS DURING ETCH IN A MAGNETORESISTIVE DEVICE," which is incorporated by reference herein in its entirety.

Figure 10:
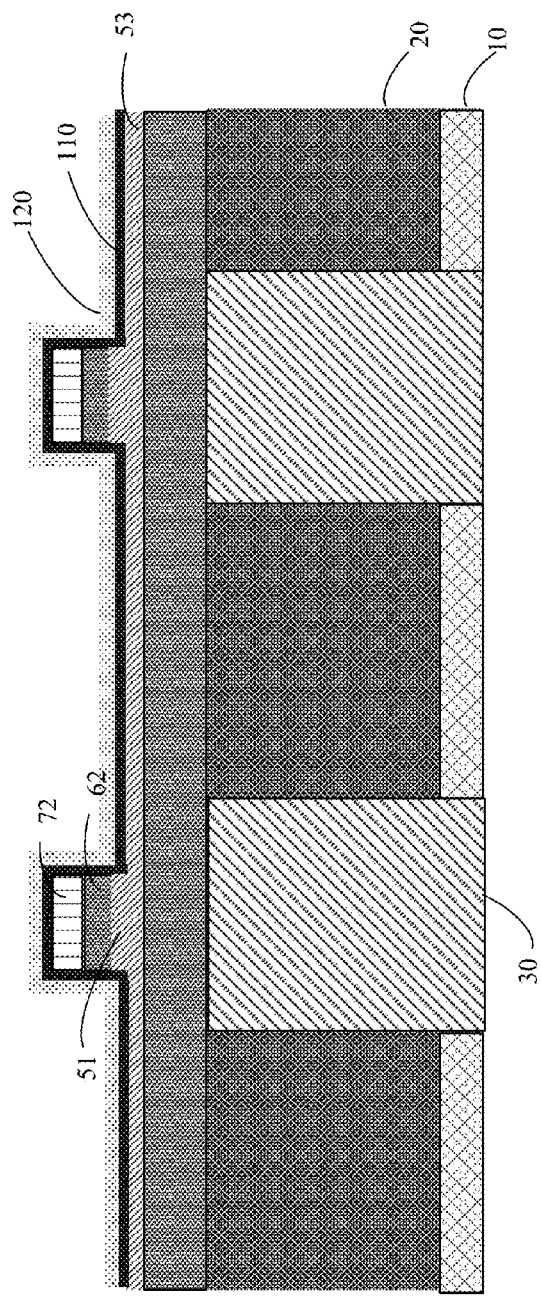

As shown in FIG. 10, following the first portion of the two-step etch process, a layer of encapsulating material 110 is deposited. The layer of encapsulating material 110 may be a dielectric material, where the dielectric constant for that material is relatively high with respect to the material used for the interlayer dielectric 20. Deposition of the encapsulating material 110 may be performed in-situ following the first etching step.

The layer of encapsulating material 110 may be deposited using chemical vapor deposition (CVD), atomic layer deposition (ALD), or using other deposition techniques now known or later developed. The layer of encapsulating material 110 is relatively thin, and may include a silicon oxide such as $SiO_2$, a silicon nitride such as $Si_3N_4$, an aluminum oxide such as $Al_2O_3$, or a magnesium oxide such as MgO, either alone or in various combinations. In some embodiments, the layer of encapsulating material 110 may be of a thickness of less than 1000 Å, whereas in other embodiments, it is less than 300 Å. In yet other embodiments, if the first etching extends into a portion of the layers underlying the magnetic layers 50, the encapsulation may extend to cover the exposed sidewalls corresponding to the underlying layers as well.

After depositing the layer of encapsulating material 110, a layer of additional hard mask material (e.g. silicon oxide) 120 may be deposited. In order to serve as a suitable hard mask material, the layer 120 may include material having a higher dielectric constant relative to interlayer dielectric material 20.

Figure 11:
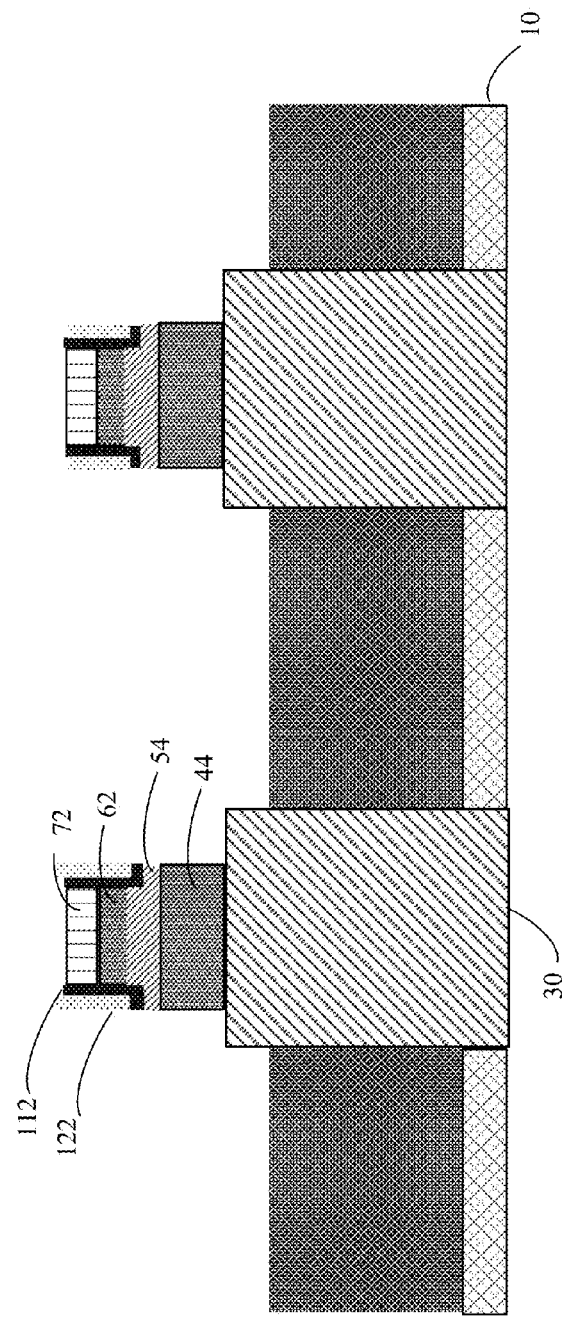
Figure 12:
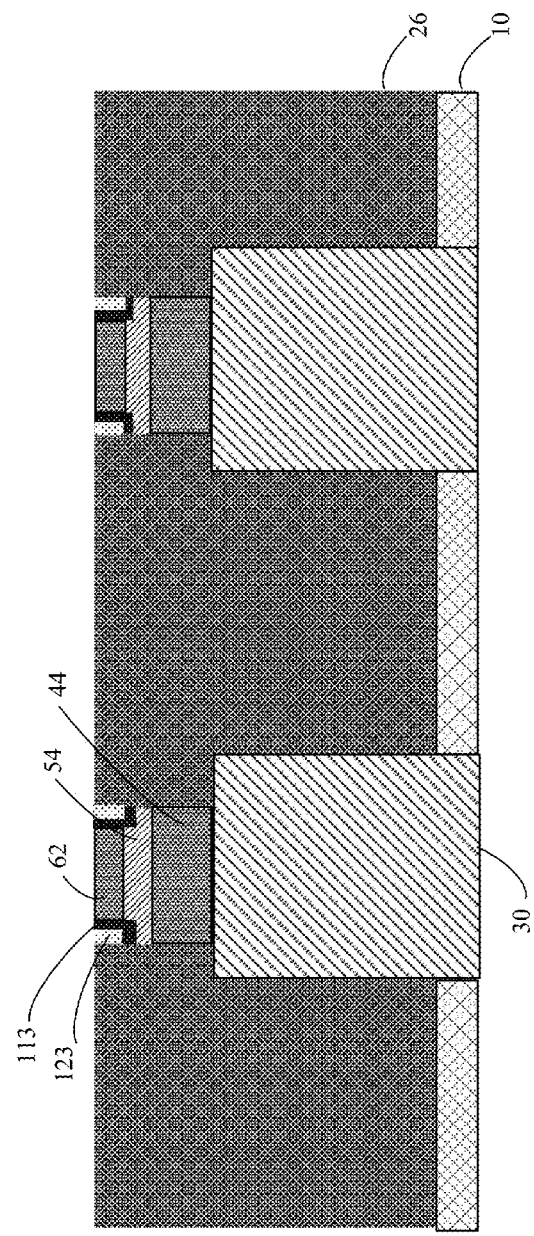

Turning to FIG. 11, the second etching step is performed, producing the magnetoresistive stack 54 and bottom electrode 44. Some residual portions 112 and 122 of the layers 110 and 120 are shown to remain. Following formation of the bottom electrode 44 and the magnetoresistive stack 54, additional low-k dielectric material is deposited to fill in the gaps between the devices and to allow for planarization. After deposition of the additional low-k dielectric material, polishing is used to remove any material above the top electrode 62. This exposes the top electrode 62 and is shown in FIG. 12. As illustrated, only very small portions 113 and 123 of the higher-dielectric constant material 110 and 120 remain.

In some embodiments, before deposition of additional low-k dielectric material and prior to planarization, an interlayer dielectric strip step can be used to further reduce the amount of higher dielectric constant material remaining. For example, such a stripping step may eliminate or reduce one or both of the portions 112 and 122 shown in FIG. 11. In such embodiments, it may be beneficial to use a thicker layer of low-k dielectric material in layer 20 as some of that layer may be removed during the stripping. In consideration of the thicker layer 20 in which the via 30 is formed, the via 30 may be made larger than it would be if placed in a thinner dielectric layer 20. Such larger vias can allow for magnetoresistive devices that have a smaller footprint to be placed completely within the footprint of the via, thereby preventing bumps that could impact the integrity of the magnetoresistive device. If the via 30 is larger than the magnetoresistive device (possibly with some additional overlay margin), the devices can be placed directly over the via, thereby avoiding any magnetic shorts resulting from the transition between metal and low-k dielectric material (i.e. possible bumps formed as a result of chemical mechanical polishing or recesses present to enable photo alignment.) Further details regarding such vias and their positioning with respect to the magnetoresistive device are included in co-pending U.S. patent application Ser. No. 14/340,209.

Figure 13:
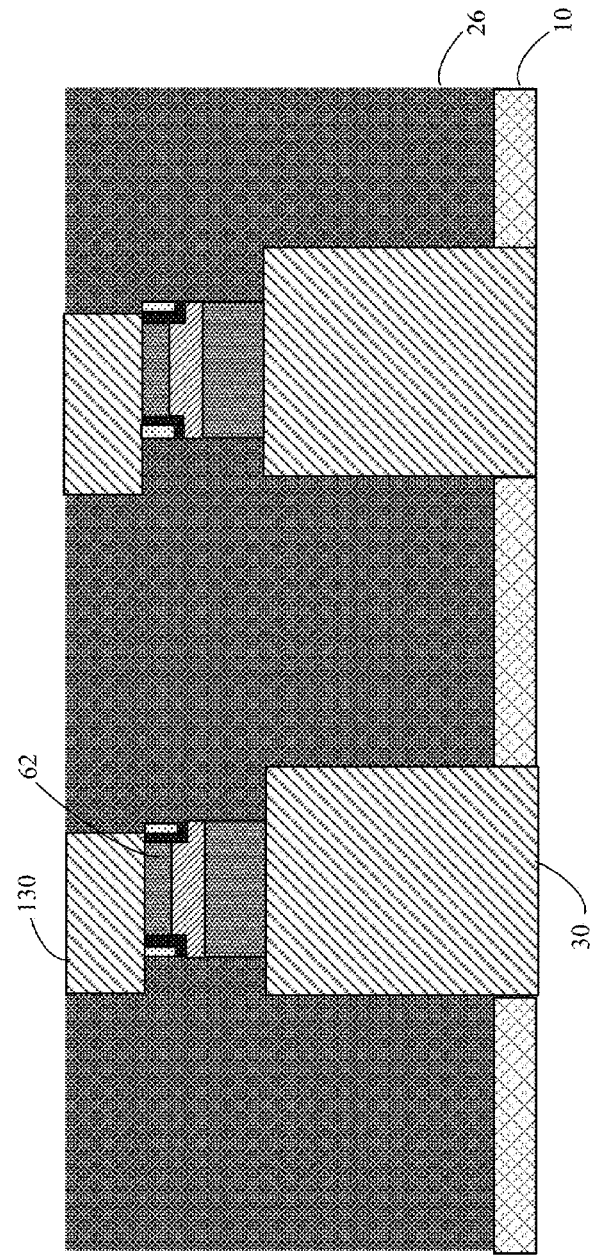

Following planarization to expose the top electrode 62, additional low-k dielectric material is deposited over the already present low-k dielectric material and the fully formed magnetoresistive device. As shown in FIG. 13, following the deposition of the additional low-k dielectric material, etching provides access to the top electrode 62 and conductive material 130 is deposited and makes electrical contact with top electrode 62. Conductive material 130 may be a via structure providing access to traces or circuit elements overlying the structure shown. In other embodiments, conductive material 130 may be a signal line such as a bit line in a magnetoresistive memory. In some embodiments, the interlayer dielectric material in which the conductive material 130 is formed may be two-layer bit line interlayer dielectric, which may include low-k etch stop material similar to that included in layer 10. Notably, while the embodiments described depict the different depositions of interlayer dielectric as being the same material, in some embodiments, the different layers of low-k interlayer dielectric may include different materials.

Figure 14:
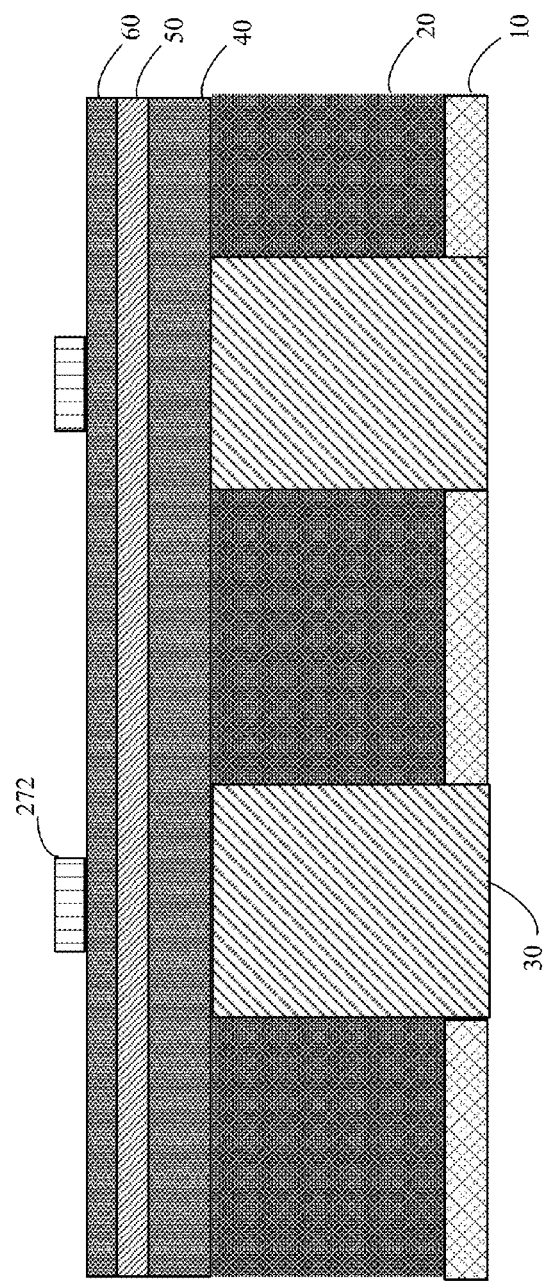
FIGS. 14-23 illustrate cross-sectional views of layers included in a magnetoresistive device during different stages of manufacturing in accordance with yet another exemplary embodiment.

FIGS. 14-23 illustrate additional embodiments that utilize two masking (patterning) steps and a two-step etch process to form the magnetoresistive device. FIG. 14 illustrates the result of a first etching step, where the starting point for the first etching step is substantially similar to the structure illustrated in FIG. 4. Notably, the via 30 is preferably large in order to minimize the aspect ratio of the metal fill used to fill the via 30. Also, the thickness of layer 20 is preferably larger in anticipation of some overetching that occurs during a strip process that may be used to remove residual higher-k dielectric material, which is discussed in more detail below.

Figure 15:
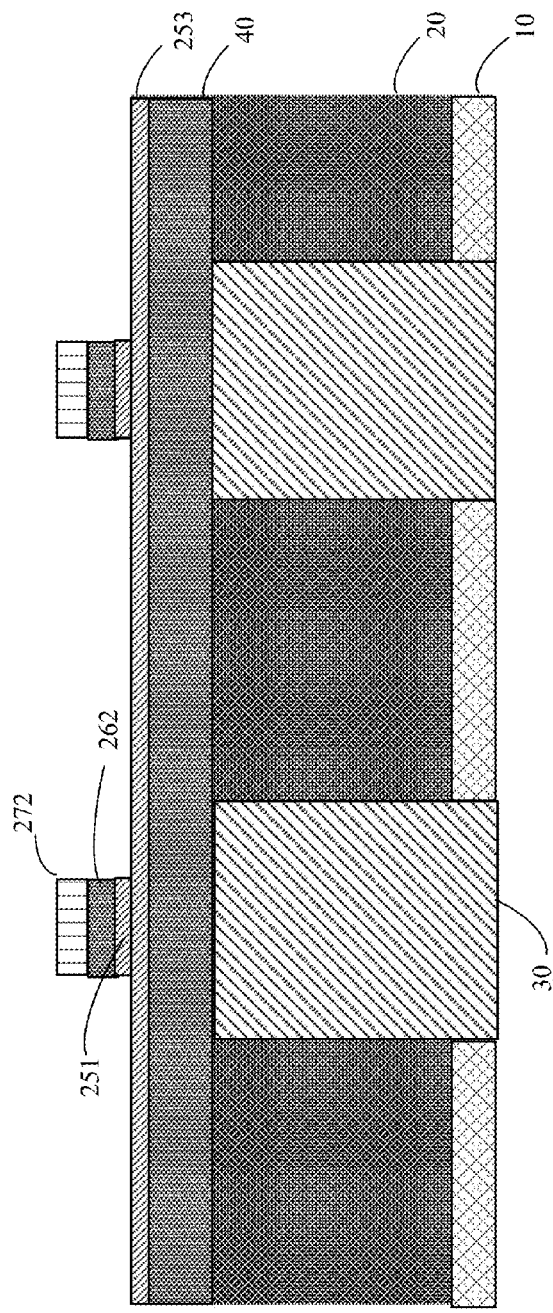

The hard mask 272 provides the pattern for formation of the top electrode 262 and a portion of the magnetoresistive stack 251, which are shown in FIG. 15. Remaining layers of the magnetoresistive stack 253 are not yet etched at the stage depicted in FIG. 15.

Figure 16:
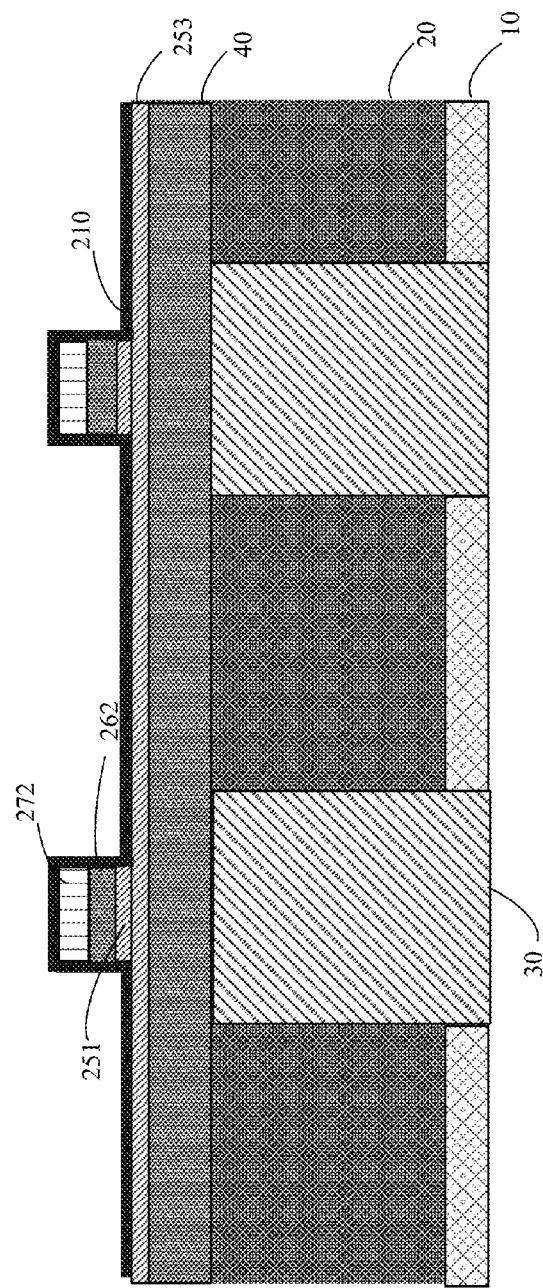
Figure 17:
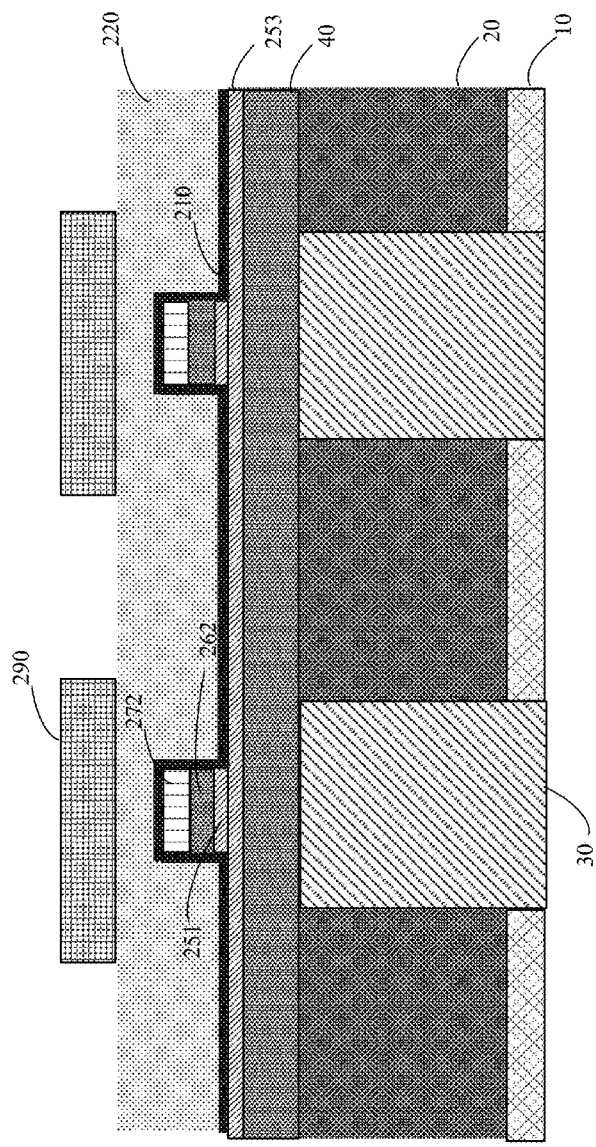

As shown in FIG. 16, following the first portion of the two-step etch process, a layer of encapsulating material 210 is deposited. The layer of encapsulating material 210 may be similar to layer 110 described above and may be formed in the same manner. Turning to FIG. 17, after depositing the layer of encapsulating material 210, a layer of additional hard mask material (e.g. silicon oxide) 220 may be deposited and planarized. In order to serve as a suitable hard mask material, the layer 220 may include material having a higher dielectric constant relative to interlayer dielectric material 20. Patterned photoresist 290 is used to pattern the lower portion of the magnetoresistive device structure. In other embodiments, the additional hard mask material may be a much thinner layer, such as that depicted in FIG. 10, and no planarization is performed prior to the second etching step.

Figure 18:
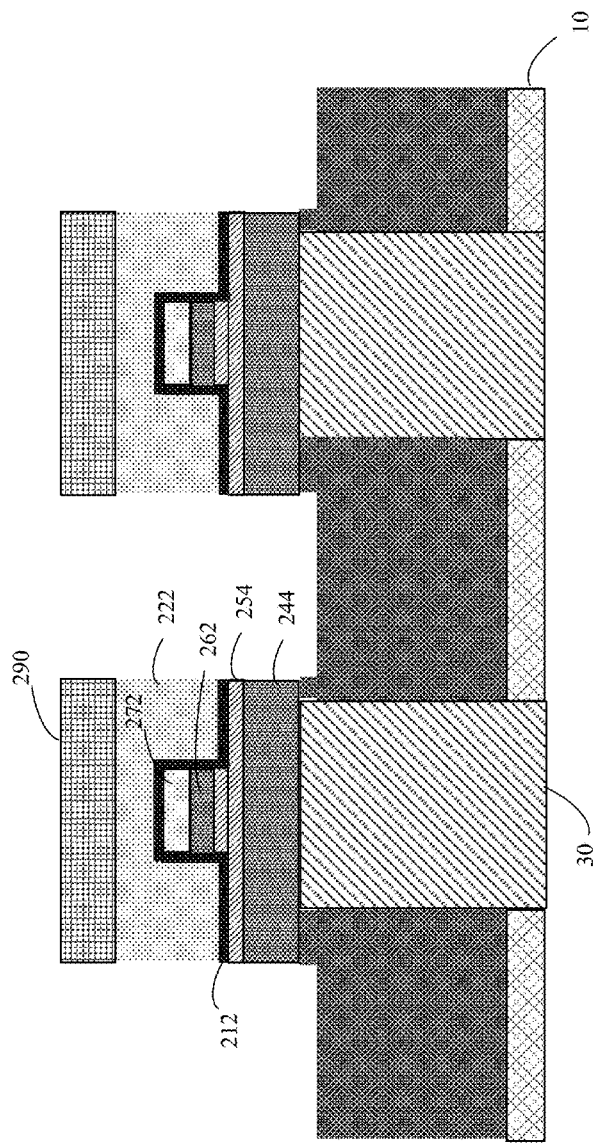
Figure 19:
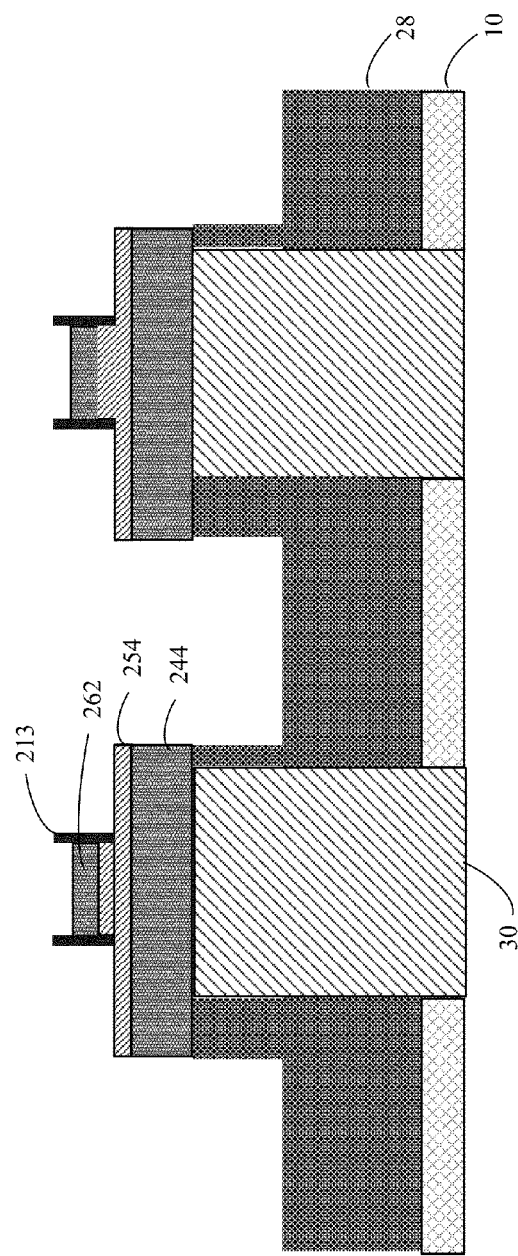

Turning to FIG. 18, the second etching step is performed, producing the magnetoresistive stack 254 and bottom electrode 244. Some residual portions 212 and 222 of the layers 210 and 220 are shown to remain. Following the second etching step, the photoresist may be stripped, and in some embodiments, an interlayer dielectric strip step is then used to further reduce the amount of higher dielectric constant material remaining. For example, such a stripping step may eliminate or reduce one or both of the portions 212 and 222. As shown in FIG. 19, all of the remaining portion of the hard mask 222 has been removed along with all but some of the vertical components of portion 212, which leaves remaining portion 213. In such embodiments, it may be beneficial to use a thicker layer of low-k dielectric material in layer 20 as some of that layer may be removed during the stripping. As shown in FIG. 19, the stripping removed a portion of layer 20, leaving remaining portion 28.

Figure 20:
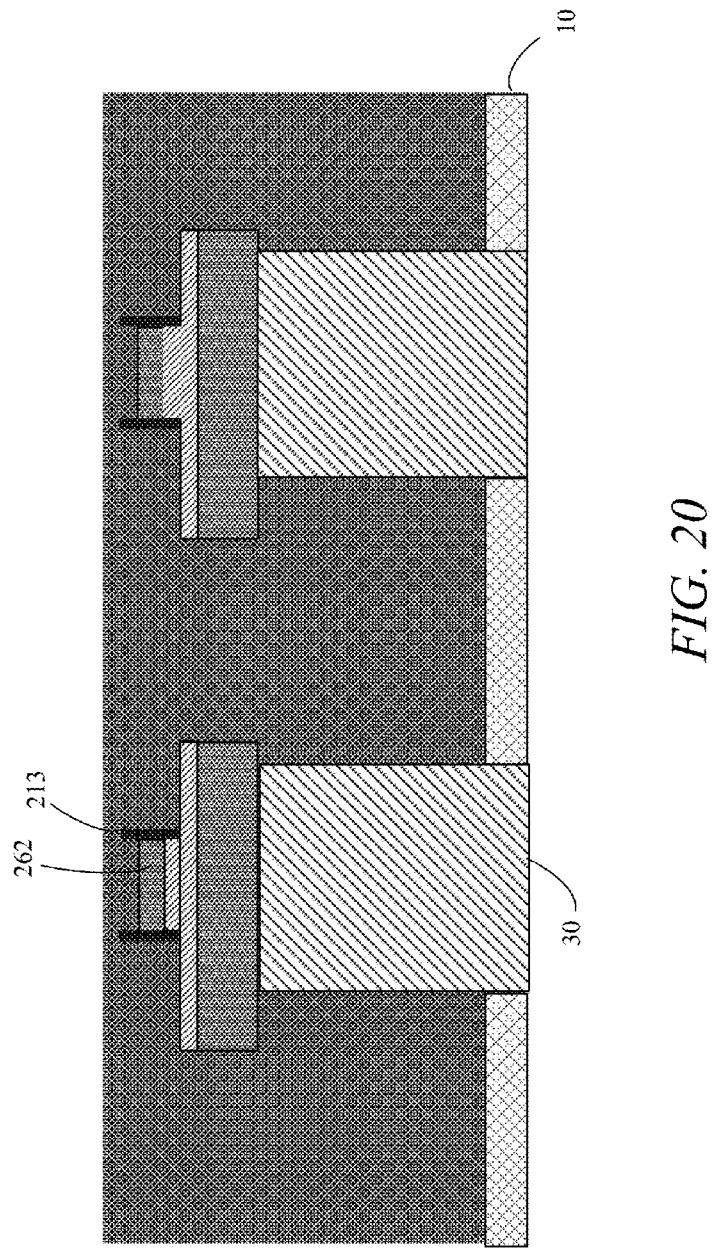
Figure 21:
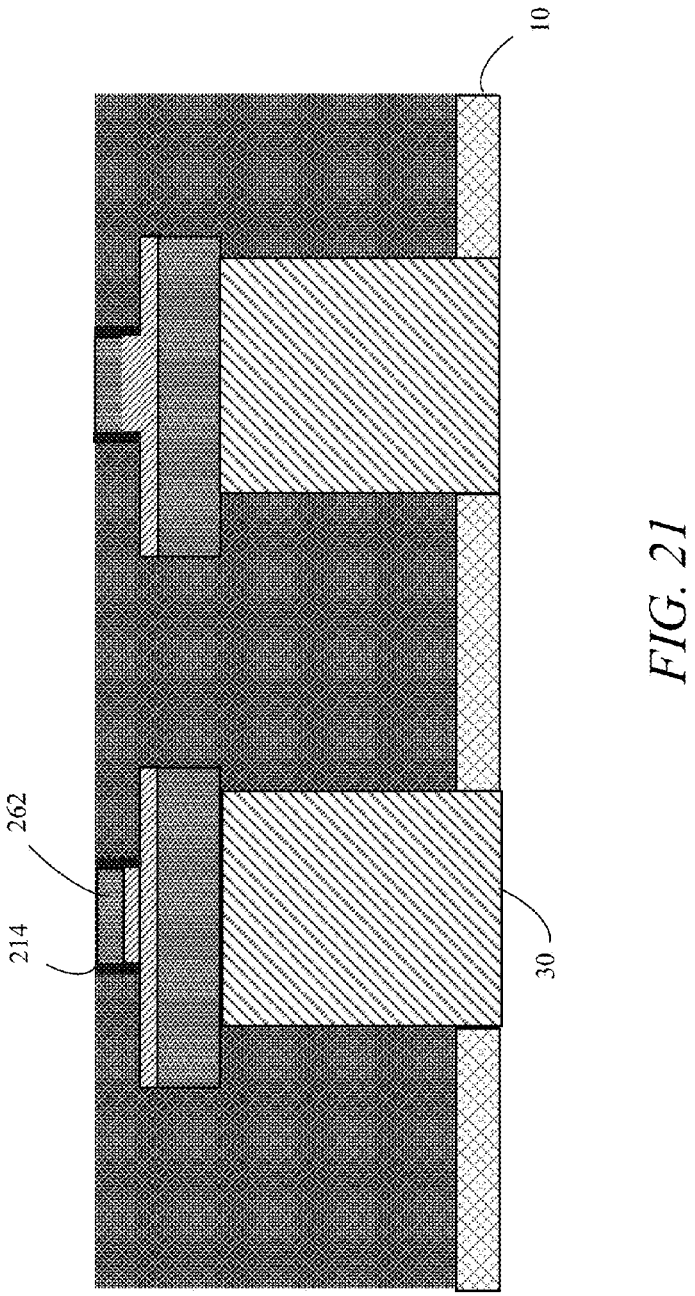

As shown in FIG. 20, following formation of the bottom electrode 244 and the magnetoresistive stack 254 and stripping of the higher-k dielectric material, additional low-k dielectric material is deposited to fill in the gaps between the devices and to allow for planarization. As shown in FIG. 21, after deposition of the additional low-k dielectric material, polishing is used to remove any material above the top electrode 262, including any residual higher-k dielectric material (e.g. portions of 213 that extend above the top electrode 262). This exposes the top electrode 262. As illustrated, only a very small portion 214 of the higher-dielectric constant material 210 remains.

Figure 22:
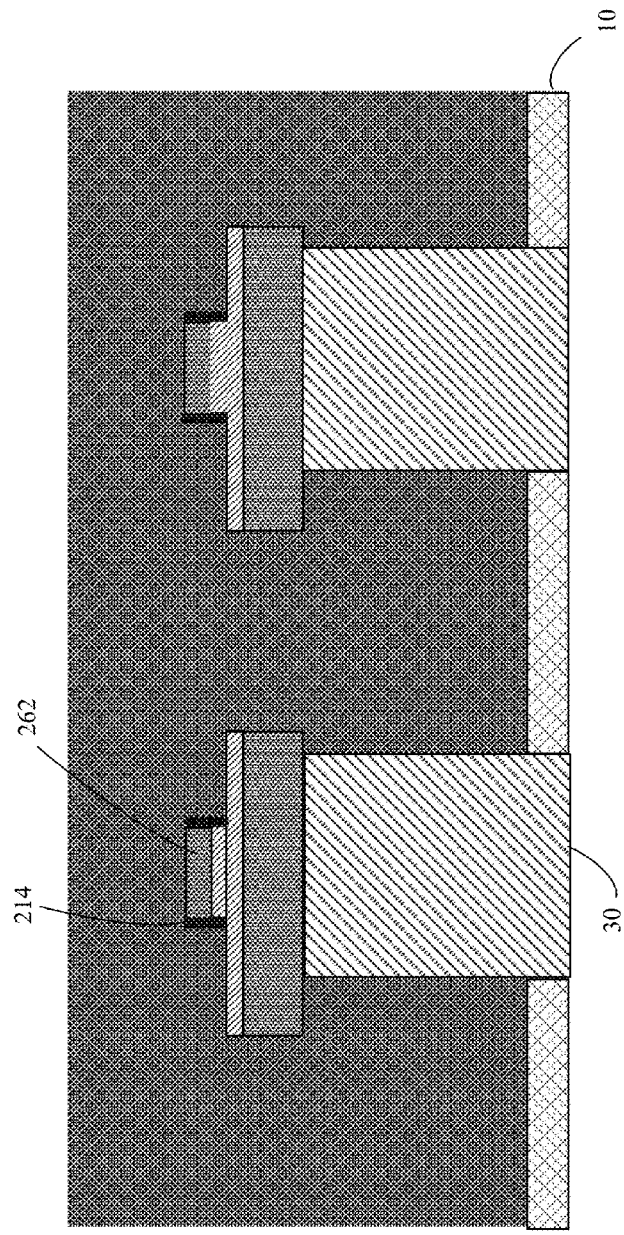
Figure 23:
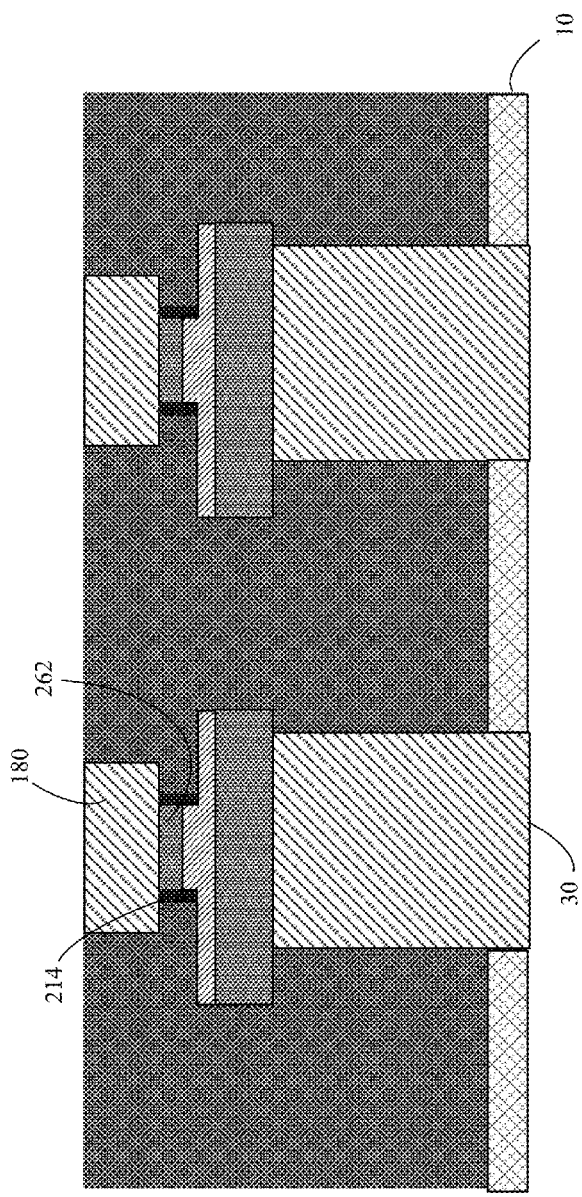

As shown in FIG. 22, following planarization to expose the top electrode 262, additional low-k dielectric material is deposited over the already present low-k dielectric material and the fully formed magnetoresistive device. As shown in FIG. 23, following the deposition of the additional low-k dielectric material, etching provides access to the top electrode 262 and conductive material 280 is deposited and makes electrical contact with top electrode 262. Conductive material 280 may be a via structure providing access to traces or circuit elements overlying the structure shown. In other embodiments, conductive material 280 may be a signal line such as a bit line in a magnetoresistive memory. In some embodiments, the interlayer dielectric material in which the conductive material 130 is formed may be two-layer bit line interlayer dielectric, which may include low-k etch stop material similar to that included in layer 10.

Figure 24:
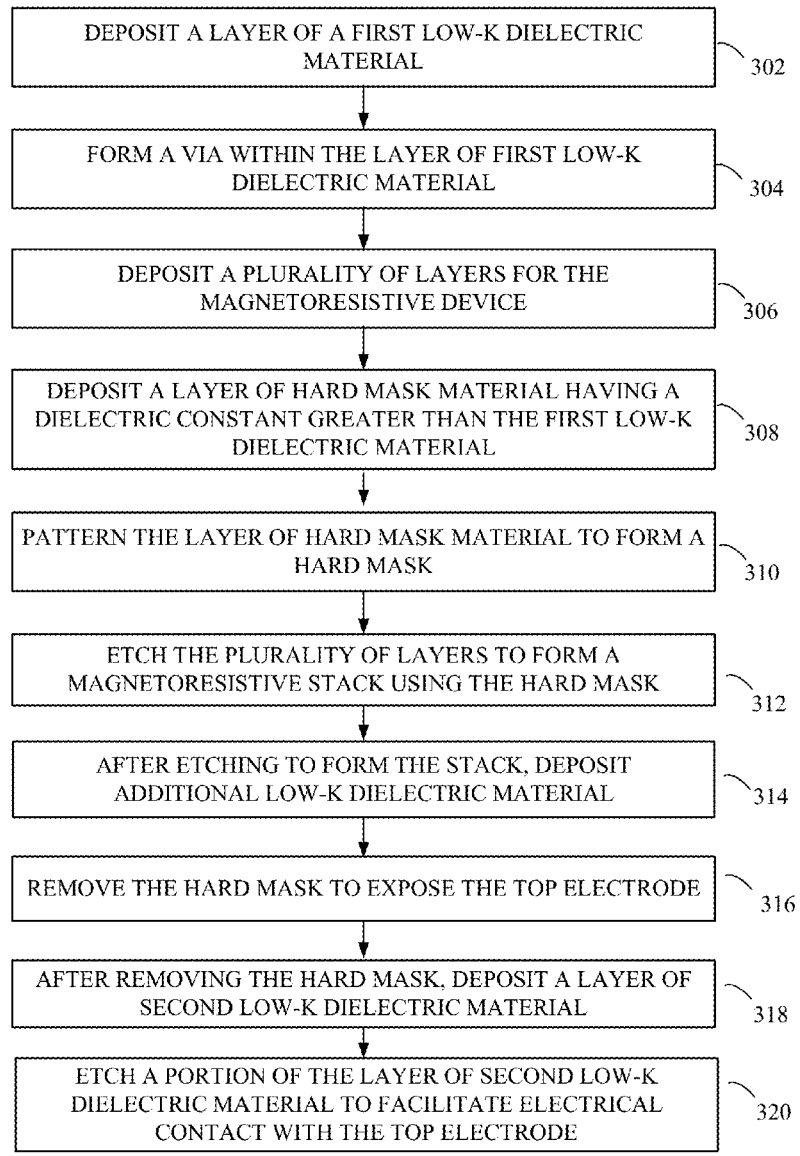
FIGS. 24 and 25 are flow charts of methods of manufacturing a magnetoresistive device in accordance with exemplary embodiments.
Figure 25:
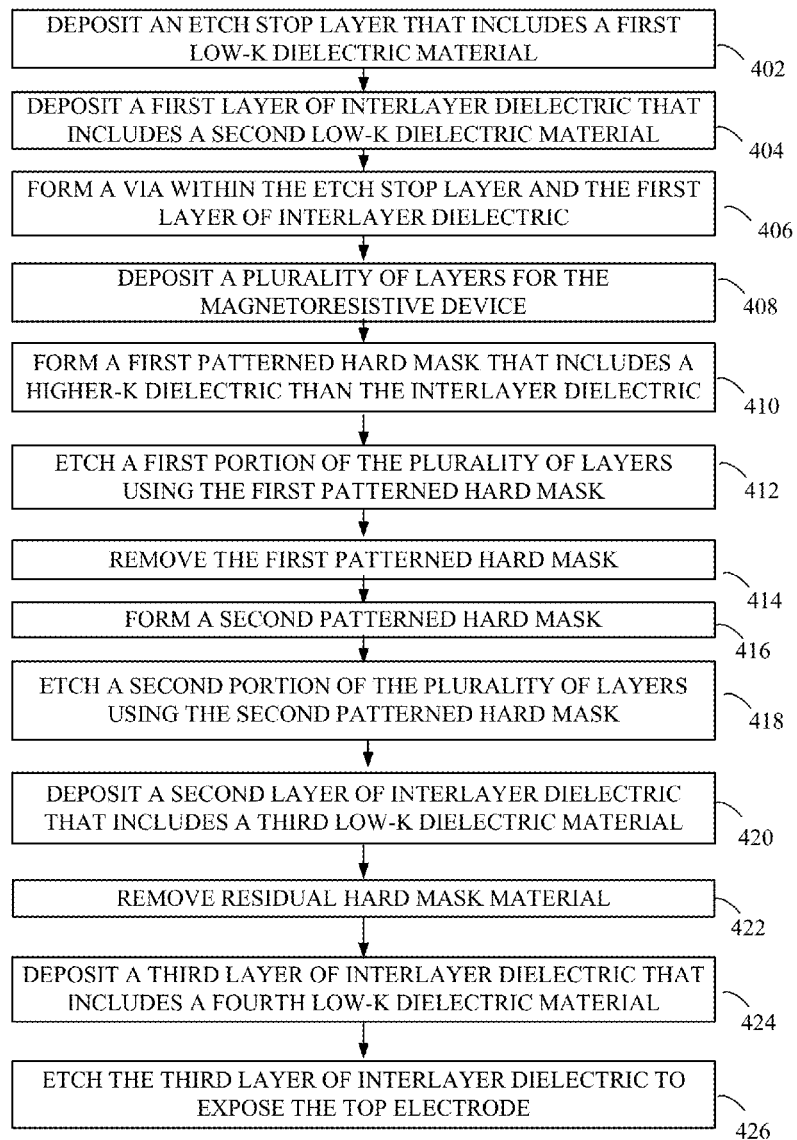

FIGS. 24-25 are flow charts that illustrate exemplary embodiments of a method of manufacturing a magnetoresistive device, where, in one example, the magnetoresistive device is an MTJ device used in an MRAM. The operations included in the flow charts may represent only a portion of the overall process used to manufacture the device. The various tasks performed in connection with methods in FIGS. 24-25 may be performed by software, hardware, firmware, or any combination thereof. For illustrative purposes, the following description of the methods in FIGS. 24-25 may refer to elements mentioned above in connection with FIGS. 1-8, 9-13, and 14-23. In practice, portions of methods may be performed by different elements of the described system, e.g., a processor, a display element, or a data communication component. It should be appreciated that methods may include any number of additional or alternative tasks, the tasks shown in FIGS. 24-25 need not be performed in the illustrated order, and the methods may be incorporated into a more comprehensive procedure or process having additional functionality not described in detail herein. Moreover, one or more of the tasks shown in FIGS. 24-25 could be omitted from an embodiment as long as the intended overall functionality remains intact.

In FIG. 24 a layer of first low dielectric constant (low-k) dielectric material is deposited at 302 on a substrate. In some embodiments, the layer of first low-k dielectric material is a composite layer that includes a first layer that functions as an etch stop layer and/or prevents metal migration as well as a second layer that includes a different type of dielectric material. In such an embodiment, the first layer may include a low-k dielectric material such as SiCOH, whereas the layer overlying the etch stop layer may include low-k dielectric material such as silicon dioxide (SiO$_2$).

At 304 a via is formed within the layer of first low-k dielectric material. Formation of the via may include patterning and selective etching to remove portions of the layer of first low-k dielectric material followed by deposition of conductive material, such as metal (e.g. copper). Once the via has been formed, a plurality of layers are deposited at 306, where the plurality of layers include the magnetic and nonmagnetic layers making up the magnetoresistive stack as well as the conductive layers used to form the top and bottom electrodes for the magnetoresistive device.

At 308, a layer of hard mask material is deposited over the plurality of layers corresponding to the magnetoresistive device. The hard mask material is a material having a dielectric constant greater than that of the first low-k dielectric material. As noted above, because low dielectric constant materials often do not work well as hard masks, a higher dielectric constant material is employed in order to ensure proper patterning of the magnetoresistive device. After the hard mask material has been deposited, the hard mask material is patterned at 310 to form a hard mask. At 312, the plurality of layers corresponding to the magnetoresistive stack are etched using the hard mask as a template for etching at least a portion of the plurality of layers. Etching of the plurality of layers results in the top electrode, the magnetoresistive stack, and the bottom electrode for the magnetoresistive device.

Etching the plurality of layers at 310 may include etching a first portion of the plurality of layers using the hard mask as a template and then encapsulating the resulting structure prior to etching the remaining portion of the plurality of layers. As discussed above, such encapsulation can be accomplished by depositing a layer of encapsulating material and then selectively etching away portions of that encapsulating material along with the underlying layers of material corresponding to the magnetoresistive stack. Such selective etching following deposition of an encapsulation layer may utilize the hard mask already patterned, or may be done after removing the initial hard mask and patterning a new hard mask. As such, the magnetoresistive stack for the device may be formed using a single-step etch or a multi-step etch, where one or more hard masks are employed during the etching process. Preferably, each of the one or more hard masks includes material having a higher dielectric constant than the low-k dielectric materials used as the interlayer dielectrics for the magnetoresistive device.

At 314, after etching the plurality of layers to form the magnetoresistive stack, additional low-k dielectric material is deposited. The additional low-k dielectric material may be substantially similar in composition to the first low-k dielectric material deposited at 302. In other embodiments, a different low-k dielectric material is used at 314. The additional low-k dielectric material deposited at 314 may be used to fill in the spaces between the magnetoresistive device and additional magnetoresistive devices. For example, in an MRAM the additional low-k dielectric may be used to separate the multiple magnetoresistive devices included in the array of memory cells.

At 316 the hard mask is removed to expose the top electrode of the magnetoresistive device. Removal of the hard mask may include removal of hard mask material corresponding to the most recently used hard mask, or multiple hard masks, in embodiments in which multiple hard masks are employed. Removal of the hard mask can include polishing, where the polishing removes the hard mask and any additional low-k dielectric material that extends above the top electrode of the magnetoresistive device. Minimization of hard mask material in the resulting magnetoresistive device helps improve the electrical characteristics of the magnetoresistive device. An interlayer dielectric strip can also be employed to further facilitate such minimization of residual hard mask material.

At 318, after removing the hard mask a layer of second low-k dielectric material is deposited. This layer also serves as an interlayer dielectric for the magnetoresistive device structure and may be substantially similar in composition to other low-k interlayer dielectrics used in manufacturing the magnetoresistive device. In other embodiments, different low-k dielectric materials may be used for different portions of the interlayer dielectric for the magnetoresistive device. At 320, a portion of the layer of second low-k dielectric material is etched to facilitate electrical contact with top electrode. Thus, selective etching of the interlayer dielectric allows for metal or other conductive material to be deposited in electrical contact with the top electrode of the magnetoresistive device. Because an electrical contact is made within this layer of interlayer dielectric, multiple sublayers of low-k dielectric material may be present, where one or more of the sublayers helps to prevent unwanted migration of conductive material.

FIG. 25 provides a flow chart of the formation of the various layers and their subsequent etching in the production of a magnetoresistive device having low-k interlayer dielectrics. At 402 an etch stop layer is deposited, where the etch stop layer includes a first low-k dielectric material. The first low-k dielectric material may be a material that is resistant to migration of conductive materials such as copper or other metals. At 404, a first layer of interlayer dielectric is deposited, where the first layer of interlayer dielectric includes a second low-k dielectric material. The second low-k dielectric material is preferably different than the first low-k dielectric material. In other embodiments, multiple low-k material layers may be deposited or only a single low-k material layer is deposited rather than the two described in 402 and 404.

At 406 a via is formed within the etch stop layer and the first layer of interlayer dielectric. Via formation can include selective etching followed by deposition of conductive material. The via provides the ability to electrically connect the bottom electrode of the magnetoresistive device to underlying circuitry (e.g. a selection transistor). At 408, a plurality of layers corresponding to the magnetoresistive device are deposited. These layers include the layers corresponding to the magnetoresistive stack as well as those that will be used to form the top and bottom electrodes for the device.

At 410 a first patterned hard mask is formed. Forming the first patterned hard mask can include deposition of a layer of hard mask material and selective etching to produce the first patterned hard mask. The material from which the first patterned hard mask is constructed is preferably a material that has a higher dielectric constant than the dielectric constant for each of the first and second low-k dielectric materials. At 412 a first portion of the plurality of layers are etched using the first patterned hard mask as a template. At 414 the first patterned hard mask is removed. Such removal can be accomplished by polishing.

At 416 a second patterned hard mask is formed. At 418 a second portion of the plurality of layers is etched using the second patterned hard mask as a template. In some embodiments, encapsulation occurs prior to etching the second portion of the plurality of layers. For example, a first patterned hard mask may be used to etch the top portion of the magnetoresistive device, which results in a partially-etched magnetoresistive stack. In one example embodiment, a portion of the magnetic layers as well as some or all of the tunnel barrier are included in the first portion of the magnetoresistive device. Following the etching of the first portion, the sidewalls of the tunnel barrier and upper magnetic layers may be encapsulated to protect those layers from subsequent etching operations corresponding to the underlying layers as those etching operation may degrade the layers if left unprotected. For example, subsequent etching or an antiferromagnetic layer or bottom electrode may use corrosive etching chemistries that would damage the upper magnetic layers or tunnel barrier. Thus, by encapsulating the partially etched magnetoresistive stack, layers susceptible to damage from subsequent etching operations can be protected.

At 420, a second layer of interlayer dielectric is deposited. The second layer of interlayer dielectric includes a third low-k dielectric material, which may be substantially similar to the composition of the other low-k dielectric materials used in the magnetoresistive device. In other embodiments, third low-k dielectric material is different than one or more of the first and second low-k dielectric materials. At 422, residual hard mask material is removed by polishing and/or by performing an interlayer dielectric strip.

At 424 a third layer of interlayer dielectric is deposited, where the third layer of interlayer dielectric includes a fourth low-k dielectric material. The fourth low-k dielectric material may be substantially similar to any one of the first, second, or third low-k dielectric materials, or, in other embodiments different low-k dielectric materials can be used for the various interlayer dielectrics. In one embodiment, the third layer of interlayer dielectric may be a composite layer that includes sublayers, where one or more of the sublayers is resistant to migration of conductive material such as copper or other metals. At 426, the third layer of interlayer dielectric is selectively etched to expose the top electrode, thereby providing electrical access to the top portion of the magnetoresistive device. Conductive material can be formed within the etched portion of the third layer of interlayer dielectric, thereby forming a contact to the top electrode of the magnetoresistive device.

By using low-k dielectric material as the inter-layer dielectric and higher-k dielectric materials for hard masks and encapsulation, the overall dielectric constant characteristics of the magnetoresistive devices can be kept lower, thereby decreasing capacitance and allowing for higher speed operations. Elimination or reduction of any residual higher-k dielectric material through stripping or other processes that remove such material minimizes "islands" of higher-k dielectric material that can detract from overall dielectric constant performance. One or more masking and one or more etching steps can be used to form the devices either with or without the additional stripping of the higher-k material.

Although the described exemplary embodiments disclosed herein are directed to various magnetoresistive-based devices and methods for making such devices, the present disclosure is not necessarily limited to the exemplary embodiments, which illustrate inventive aspects that are applicable to a wide variety of semiconductor processes and/or devices. Thus, the particular embodiments disclosed above are illustrative only and should not be taken as limitations, as the embodiments may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the inventions as defined by the appended claims so that those skilled in the art should understand that they can make various changes, substitutions and alterations without departing from the spirit and scope of the inventions in their broadest form.

What is claimed is:

1. A method of manufacturing a magnetoresistive device, comprising:
    depositing a layer of a first low-dielectric constant (low-k) dielectric material;
    forming a via within the layer of first low-k dielectric material;
    depositing a plurality of layers for the magnetoresistive device on the layer of first low-k dielectric material;
    depositing a layer of hard mask material over the plurality of layers for the magnetoresistive device, wherein the layer of hard mask material has a higher dielectric constant than the layer of first low-k dielectric material;
    patterning the layer of hard mask material to form a hard mask;
    etching a first portion of the plurality of layers for the magnetoresistive device using the hard mask as a template, wherein etching the first portion of the plurality of layers includes forming a top electrode;
    after etching the first portion, depositing a layer of encapsulating material;
    after depositing the layer of encapsulating material, depositing a layer of additional hard mask material, wherein the additional hard mask material has a higher dielectric constant than the first low-k dielectric material; and
    after depositing the layer of additional hard mask material, etching a second portion of the plurality of layers to produce a magnetoresistive stack and a bottom electrode for the magnetoresistive device, wherein etching the second portion of the plurality of layers includes etching the first layer of low-k dielectric material below a top surface of the via;
    after etching the second portion, performing an interlayer dielectric strip to reduce an amount of residual higher-dielectric constant material, wherein some residual higher-dielectric constant material remains on sidewalls of the top electrode after the interlayer dielectric strip;
    after performing the interlayer dielectric strip, depositing additional low-k dielectric material; and
    after depositing the additional low-k dielectric material, polishing to remove any material above the top electrode to expose the top electrode.

2. The method of claim 1 further comprising:
    after polishing to expose the top electrode, depositing a layer of second low-k dielectric material; and
    etching a portion of the layer of second low-k dielectric material to facilitate electrical contact with the top electrode.

3. The method of claim 1, further comprising:
    after depositing the layer of first low-k dielectric material and before forming the via, depositing a layer of third low-k dielectric material, wherein the third low-k dielectric material is different than the first low-k dielectric material; and wherein forming the via further comprises forming the via in the layer of first low-k dielectric material and in the layer of third low-k dielectric material.

4. The method of claim 3, wherein at least one of the first and third low-k dielectric materials acts as an etch-stop layer.

5. The method of claim 3, at least one of the first and third low-k dielectric materials prevents migration of metal material.

6. The method of claim 3, wherein the first low-k dielectric material includes SiCOH and the third low-k dielectric material includes silicon dioxide ($SiO_2$).

7. The method of claim 3, wherein the second low-k dielectric material, the additional low-k dielectric material, and the third low-k dielectric material are composed of the same material.

8. The method of claim 1, wherein depositing the additional low-k dielectric material includes filling spaces between the magnetoresistive device and additional magnetoresistive devices.

9. A method of manufacturing a magnetoresistive device, comprising:
   depositing an etch stop layer that includes a first low-dielectric constant (low-k) dielectric material;
   depositing a first layer of interlayer dielectric that includes a second low-k dielectric material;
   forming a via within the etch stop layer and the first layer of interlayer dielectric;
   depositing a plurality of layers for the magnetoresistive device over the via;
   forming a patterned hard mask over the plurality of layers for the magnetoresistive device, wherein the patterned hard mask includes a dielectric having a higher dielectric constant than the first and second low-k dielectric materials;
   etching a first portion of the plurality of layers for the magnetoresistive device using the patterned hard mask as a template to form a partially-etched magnetoresistive stack and a top electrode;
   encapsulating the partially-etched magnetoresistive stack;
   after the encapsulating, etching a second portion of the plurality of layers for the magnetoresistive device, wherein etching the second portion of the plurality of layers includes etching the first layer of interlayer dielectric below a top surface of the via;
   after etching the second portion of the plurality of layers, performing an interlayer dielectric strip to reduce an amount of residual higher-dielectric constant material, wherein some residual higher-dielectric constant material remains on sidewalls of the top electrode after the interlayer dielectric strip;
   after performing the interlayer dielectric strip, depositing a second layer of interlayer dielectric that includes a third low-k dielectric material;
   after depositing the second layer of interlayer dielectric, removing residual hard mask material above the top electrode to expose the top electrode of the magnetoresistive device;
   after removing the residual hard mask material, depositing a third layer of interlayer dielectric that includes a fourth low-k dielectric material;
   etching the third layer of interlayer dielectric to expose the top electrode; and
   forming conductive material within an etched portion of the third layer of interlayer dielectric, wherein the conductive material facilitates electrical contact with the top electrode.

10. The method of claim 9, wherein depositing the third layer of interlayer dielectric includes depositing low-k dielectric material that reduces migration of conductive materials.

11. A method of manufacturing a magnetoresistive device, comprising:
   depositing a plurality of layers for the magnetoresistive device, wherein the plurality of layers are deposited over a via and an underlying layer of low-dielectric constant (low-k) dielectric material, wherein the via is formed within the underlying layer of low-k dielectric material;
   forming a patterned hard mask over the plurality of layers for the magnetoresistive device, wherein the patterned hard mask includes a dielectric material;
   etching a first portion of the plurality of layers for the magnetoresistive device using the patterned hard mask as a template, wherein etching the first portion forms a partially etched magnetoresistive stack and a top electrode;
   encapsulating the partially-etched magnetoresistive stack;
   after the encapsulating, depositing a layer of additional hard mask material; and
   etching a second portion of the plurality of layers for the magnetoresistive stack to produce the magnetoresistive stack and a bottom electrode for the magnetoresistive device, wherein etching the second portion of the plurality of layers includes etching the underlying layer of low-k dielectric material below a top surface of the via;
   after etching the second portion of the plurality of layers, performing an interlayer dielectric strip that reduces at least an amount of remaining additional hard mask material, wherein some residual dielectric material remains on sidewalls of the top electrode after the interlayer dielectric strip;
   after performing the interlayer dielectric strip, depositing a first layer of interlayer dielectric that includes a first low-dielectric constant (low-k) dielectric material having a dielectric constant lower than a dielectric constant of the dielectric material of the patterned hard mask and the additional hard mask material;
   after depositing the first layer of interlayer dielectric, removing residual material above the top electrode to expose the top electrode of the magnetoresistive device;
   after removing the residual material, depositing a second layer of interlayer dielectric that includes a second low-k dielectric material having a dielectric constant lower than the dielectric constant of the dielectric material of the patterned hard mask and lower than a dielectric constant of the additional hard mask material; and
   etching the second layer of interlayer dielectric to expose the top electrode.

12. The method of claim 11, wherein the first and second low-k dielectric materials are composed of a same material.

13. The method of claim 1, wherein performing the interlayer dielectric strip also reduces a residual portion of the layer of encapsulating material.

14. The method of claim 9, further comprising:
   after the encapsulating and prior to etching the second portion of the plurality of layers, depositing a layer of additional hard mask material.

15. The method of claim 14, wherein performing the interlayer dielectric strip reduces residual portions of the additional hard mask material and reduces material used in the encapsulating.

16. The method of claim 11, wherein performing the interlayer dielectric strip also reduces an amount of remaining material used in the encapsulating.

\* \* \* \* \*